(12) United States Patent
Yang

(10) Patent No.: US 6,569,700 B2
(45) Date of Patent: May 27, 2003

(54) METHOD OF REDUCING LEAKAGE CURRENT OF A PHOTODIODE

(75) Inventor: Sheng-Hsiung Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/878,369

(22) Filed: Jun. 12, 2001

(65) Prior Publication Data

US 2002/0187581 A1 Dec. 12, 2002

(51) Int. Cl.$^7$ ................................................ H01L 21/00
(52) U.S. Cl. .................... 438/48; 438/510; 438/514; 438/522; 257/292
(58) Field of Search ..................... 438/48, 510, 514, 438/527, 561

(56) References Cited

U.S. PATENT DOCUMENTS

| | | | | |
|---|---|---|---|---|
| 6,140,156 A | * | 10/2000 | Tsai | ........................ 438/148 |
| 6,177,333 B1 | * | 1/2001 | Rhodes | ........................ 438/433 |
| 6,194,258 B1 | * | 2/2001 | Wuu | ........................ 438/200 |
| 6,228,750 B1 | * | 5/2001 | Shibib | ........................ 438/558 |
| 6,309,905 B1 | * | 10/2001 | Yaung et al. | ................ 438/48 |

* cited by examiner

*Primary Examiner*—David Nelms
*Assistant Examiner*—Thao P Le
(74) *Attorney, Agent, or Firm*—Winston Hsu

(57) ABSTRACT

A method of reducing leakage current of a photodiode on a semiconductor wafer. The semiconductor wafer has a p-type substrate, a photosensing area, and at least one shallow trench surrounding the photosensing area. First, a doped polysilicon layer containing p-type dopants is formed in the shallow trench. Then, the p-type dopant in the doped polysilicon layer is caused to diffuse into the p-type substrate to form a p-type doped region surrounding a bottom of the shallow trench and walls of the shallow trench. After that, the doped polysilicon layer is removed and an insulator material is filled into the shallow trench to form a shallow trench isolation (STI) structure. Finally, an n-type doped region is implanted to form a photosensor. Here, the p-type doped region in the photosensing area is used to decrease the electric field surrounding the photosensing area and decrease the leakage current.

18 Claims, 4 Drawing Sheets

METHOD OF REDUCING LEAKAGE CURRENT OF A PHOTODIODE

BACKGROUND OF THE INVENTION

1. Field of the Invention

The present invention relates to a method of reducing leakage current of a photodiode, and more particularly, to a method of reducing leakage current of a photosensing area of a photodiode.

2. Description of the Prior Art

A photodiode is a semiconductor device comprising a photoconductivity cell and a junction diode, and is commonly used in photoelectric products, such as cameras and photosensors of scanners. A light-induced current of the photodiode represents a signal, whereas a current present in an absence of light represents noise. The photodiode processes signal data by using a magnitude of a signal-to-noise ratio. In the semiconductor industry, it is often desirable to increase the light-induced current of the photodiode so as to increase the signal-to-noise ratio, and hence to enhance a contrast of the signal. A sensitivity of the photodiode is enhanced and a quality of the photodiode is improved.

Please refer to FIG. 1. FIG. 1 is a cross-sectional diagram of a structure of a photodiode 30 according to the prior art. The semiconductor wafer 10 comprises a silicon substrate 12, and a p-well 14 positioned on the silicon substrate 12. The photodiode 30 comprises a photosensing area 16 positioned on the surface of the p-well 14. Additionally, the semiconductor wafer 10 comprises an insulation layer 18 positioned on the surface of the silicon substrate 12. The insulation layer 18 surrounds the photosensing area 16 and serves as an insulating material to prevent short-circuiting between the photosensing area 16 and other units.

According to the prior art method of forming the photosensing area 16 of the photodiode 30, an ion implantation process is first performed to form an n-type doped region 20 on the surface of the p-well 14. Arsenic (As), with an energy of about 80 KeV and a dosage about $10^{15}$ ion/cm$^2$, is used as a major dopant in the ion implantation process. A depletion region 22 for detecting the leakage current is formed along the PN junction between the doped region 20 and the adjacent p-type well 14. In FIG. 1, the area marked with slanting lines illustrates the depletion region 22.

In the formation of the photodiode 30 according to the prior art, dopants with an energy of about 80 KeV used in the ion implantation process not only create a deeper PN junction depth, but also damage a crystal structure on a surface of the photosensing area 16. Thus, more dark current (that is, current in the absence of light) is generated at the interface between the p-well 14 and the doped region 20 below the insulation layer 18. As a result, the signal-to-noise ratio and the sensitivity of the photodiode 30 are reduced.

SUMMARY OF THE INVENTION

It is therefore a primary objective of the present invention to provide a method of reducing leakage current of a photodiode that increases signal-to-noise ratio and sensitivity.

The present invention provides a method of reducing leakage current of a photodiode in a semiconductor wafer. The semiconductor wafer comprises a p-type substrate, a photosensing area for forming a photosensor of the photodiode, and at least one shallow trench surrounding the photosensing area to prevent short-circuiting between the photosensing area and other units. The method of the present invention is forming a doped polysilicon layer containing p-type dopants in the shallow trench. Then a thermal process is performed to cause the p-type dopant in the doped polysilicon layer to diffuse into the p-type substrate to form a p-type doped region surrounding a bottom of the shallow trench and walls of the shallow trench. After that, the doped polysilicon layer is removed and an insulator material is filled into the shallow trench to form a shallow trench isolation (STI) structure. A first n-type implantation process is performed with arsenic or phosphorus ions to form a first n-type doped region in the photosensing area of the photodiode. Then a second n-type implantation process is performed with the arsenic or phosphorus ions to form a second n-type doped region in the photosensing area of the photodiode. Here, the p-type doped region surrounding the trench is used to decrease the electric field in the interface between the photosensing area and the insulation layer to reduce the leakage current.

It is an advantage of the present invention that a p-type doped region is formed at the interface between the insulation layer and the photosensing area to reduce leakage current efficiently and enhance the performance of the photodiode.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
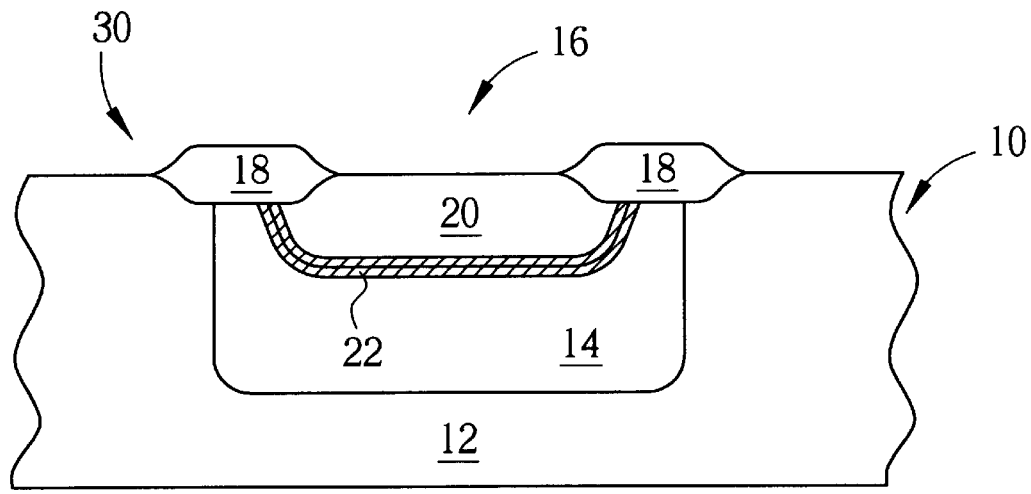
FIG. 1 is a cross-sectional diagram of a structure of the prior art photodiode.
Figure 2:
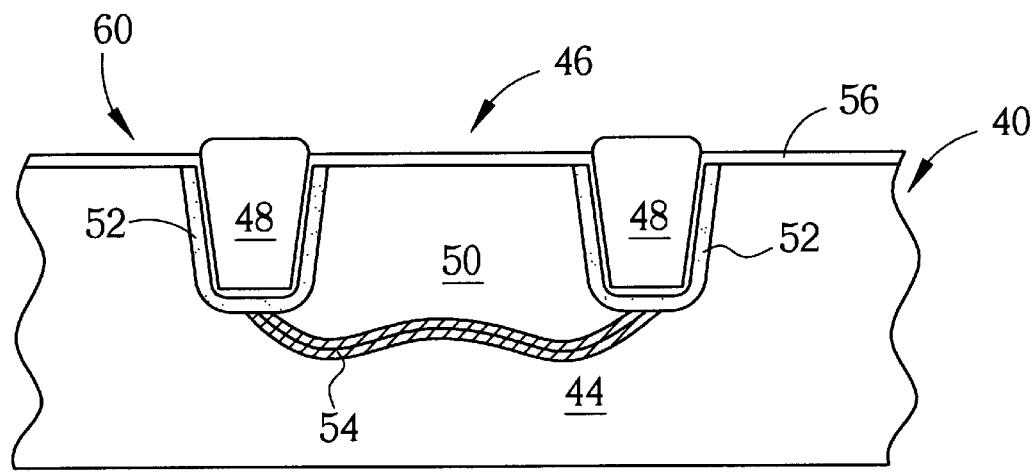
FIG. 2 is a cross-sectional diagram of a structure of the present invention photodiode.

Please refer to FIG. 2. FIG. 2 is a cross-sectional diagram of a structure of the present invention photodiode 60. The photodiode 60 comprises a photosensing area 46 positioned inside a p-type substrate 44 in a semiconductor 40, at least one shallow trench isolation (STI) layer 48 positioned on a surface of the p-type substrate 44 surrounding the photosensing area 46, and a p-type doped region 52 positioned on a bottom of and surrounding the trench.

Figure 3:
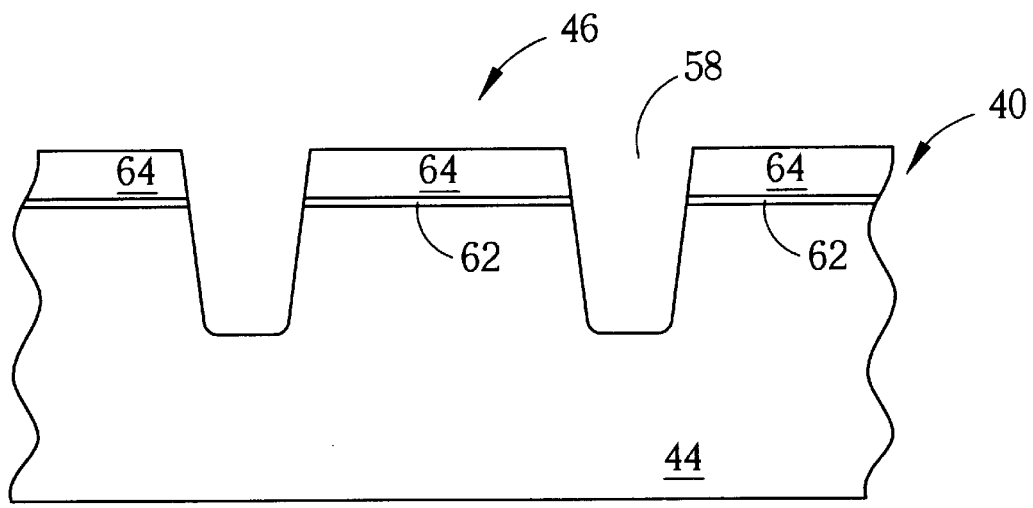
FIG. 3 to FIG. 8 are cross-sectional diagrams of forming a photosensing area of a photodiode according to the present invention.

Please refer to FIG. 3 to FIG. 8. FIG. 3 to FIG. 8 are cross-sectional diagrams of forming the photosensing area 44 of the photodiode 60 on the semiconductor wafer 40 according to the present invention. As shown in FIG. 3, the semiconductor wafer 40 comprises a p-type substrate 44. Then, a pad oxide layer 62 and a nitride layer 64 are formed, respectively, by methods of oxidation and chemical vapor deposition in turn. A conventional lithographic process is performed to form a patterned photoresist layer (not shown) on the surface of the semiconductor wafer 40. Then an etching of the nitride layer 64 and the pad oxide layer 62 is performed. The photoresist is removed, and the p-type substrate 44 with a mask of the nitride layer 64 is etched to form at least one shallow trench 58 surrounding the predetermined photosensing area 46.

Figure 4:
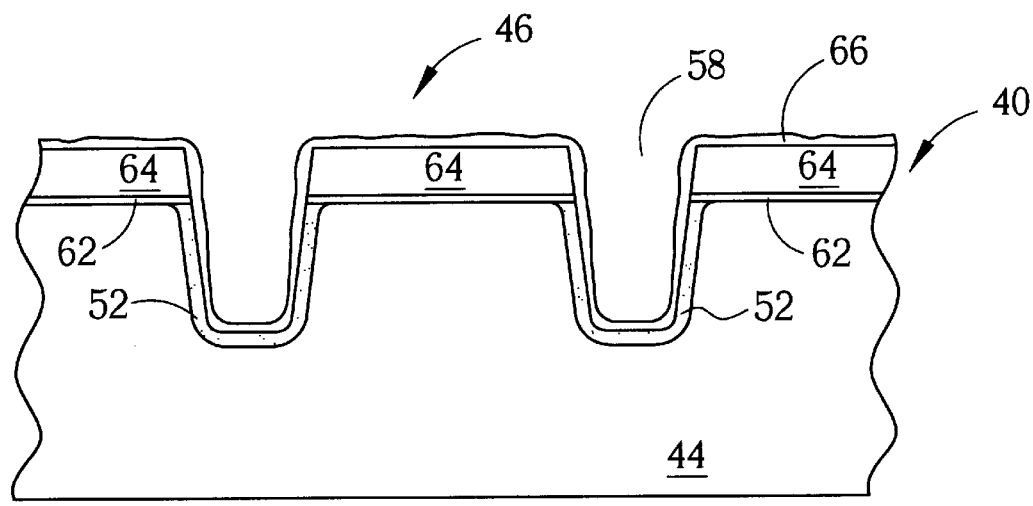

Please refer to FIG. 4. After the shallow trench 58 is formed, a polysilicon layer 66 doped with a p-type dopant is deposited on the semiconductor wafer 40 surface to form a polysilicon layer 66 attached on the bottom and sidewall of the shallow trench 58. Then, a thermal process is performed to cause the dopant in the polysilicon to diffuse into the portions of the p-type substrate 44 that surround the bottom of the shallow trench and the walls of the shallow trench, thereby forming the p-type doped region 52. The p-type dopants can be boron atoms (B) or boron trifluoride ($BF_3$), and the dopant dosage in the p-type doped region 52 is in a range of $6 \times 10^{15}$ to $1 \times 10^{18}$ (ion/$cm^3$).

Figure 5:
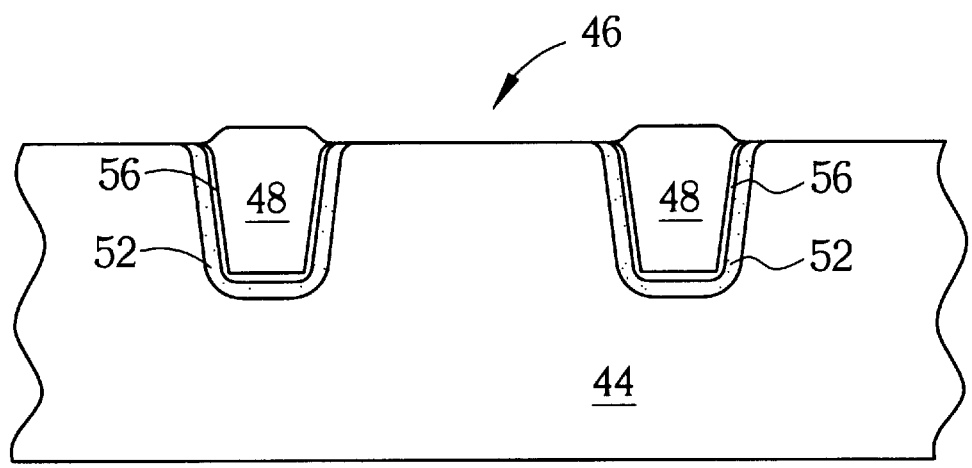

Please refer to FIG. 5. Removing the polysilicon layer 66 on the semiconductor wafer 40 surface, an insulate material 48 is filled into the shallow trench 58 according to the ordinary skill of STI (shallow trench isolation). A CMP (chemical mechanical polishing) process is performed to plane the insulating material 48. After that, the nitride layer 64 and pad oxide 62 are removed to complete the STI process, wherein an SRO (silicon-rich oxide) layer 56 may be formed before insulating material 48 is filled into the shallow trench 58. Specifics of the STI process should be obvious to one with ordinary skill in the art, and therefore the STI process is not described in detail.

Figure 6:
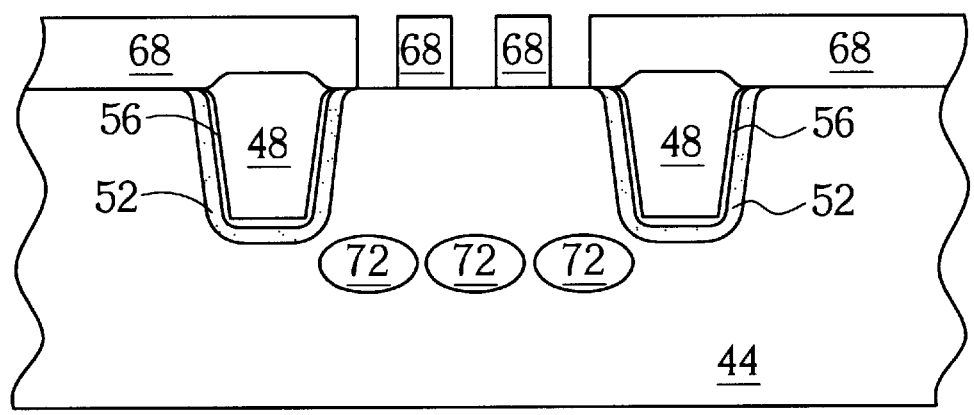

Please refer to FIG. 6. A conventional lithographic process is performed to form a patterned photo resist layer 68 on the surface of the semiconductor wafer 40. An ion implantation process is then performed, using the photoresist layer 68 as a hard mask, to form at least three n-type doped regions 72 in the p-type substrate 44 of the photosensing area 46. The n-type doped regions 72 are not interconnected. Arsenic (As) or phosphorous (P) ions with a dosage in a range of $8 \times 10^{15}$ (ion/$cm^2$) to $6 \times 10^{16}$ (ion/$cm^2$) are used as the major dopant in the ion implantation process.

Figure 7:
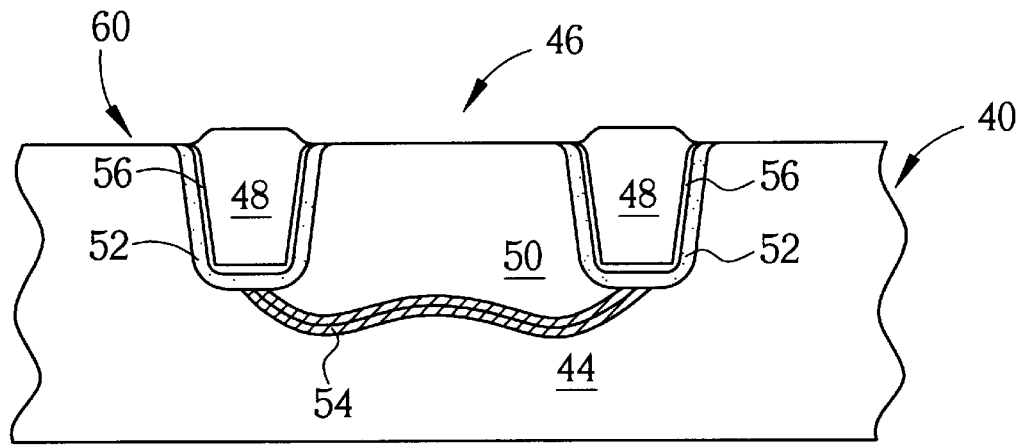

Please refer to FIG. 7. An annealing process at a temperature between 800° C. and 1000° C. is then performed, after the photoresist layer 68 has been totally removed, to drive the dopants in the n-type doped regions 72 into the p-type substrate 44 and join the dopants together to form an n-type doped region 50. The bottom of the n-type doped region 50 follows the distribution of each n-type doped region 72, creating a smooth shape to reduce the leakage current from the bottom of the n-type doped region 50. Furthermore, the dopants in the n-type doped region 50 interact with the p-type substrate 44 to form a depletion region 54, which enhances the sensitivity of the photodiode 60.

Figure 8:
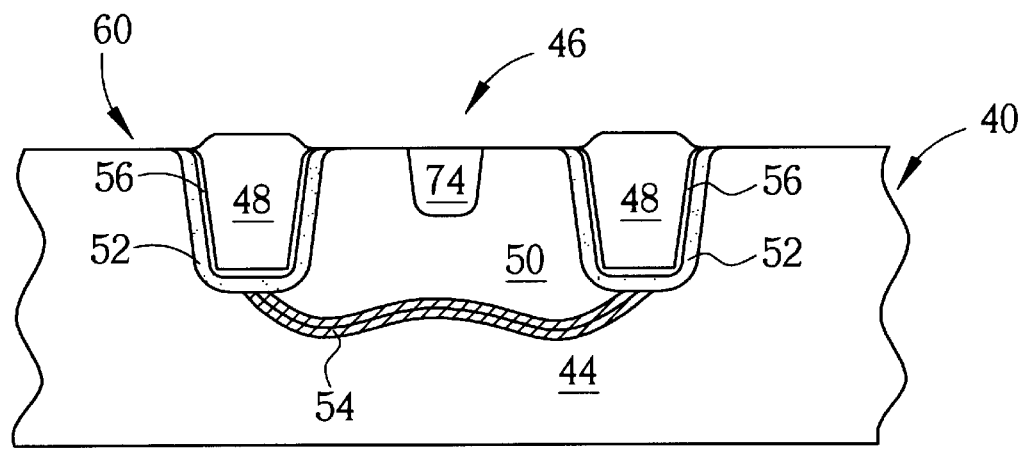

Please refer to FIG. 8. A conventional lithographic process is performed to form a patterned photoresist layer (not shown) on the surface of the semiconductor wafer 40. An ion implantation process is then performed, using the photoresist layer as a hard mask, to form an n-type doped region 74 with a shallow junction depth in the doped region 50. The n-type doped region 74 serves as a conductive wire that electrically connects the photosensing area 46 to at least one other device on the semiconductor wafer 40. The major dopant used in this second ion implantation process is Arsenic (As) or phosphorous (P) ions with a dosage in a range of $1 \times 10^{19}$ (ion/$cm^2$) to $1 \times 10^{20}$ (ion/$cm^2$).

In the present invention method of forming the photosensing area 46 of the photodiode 60, the doped region 52 is formed in the p-type substrate surrounding the shallow trench 58 by diffusion. The doped region 52 obviously enhances the isolated effect to prevent the blooming phenomenon. Additionally, it serves to reduce the electric field around the depletion 54 and thus reduces leakage current to improve the sensitivity of photodiode to blue light.

In contrast to the prior art, the present invention uses the STI structure to insulate the photosensing area 46 to improve the isolation. Moreover, a doped region 52 formed at the interface between the insulation layer 48 and the depletion 54 to reduce the electric field, especially the crystal lattice defects with high stress from the bird's beak under the insulating material 48. In addition, the distribution of dopants at the bottom of the depletion region 54 and the doped region 50 has a smooth shape that reduces leakage current from the bottom of the depletion region 54 to the p-type substrate 44. As a result, the present invention reduces leakage current and enhances the performance of the photodiode 60.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of reducing leakage current of a photodiode on a semiconductor wafer, the surface of the semiconductor wafer comprising a p-type substrate, a photosensing area for forming a photosensor of the photodiode, and a shallow trench positioned in the substrate surrounding the photosensing area, the method comprising:

forming a doped polysilicon layer containing p-type dopants in the shallow trench;

using a thermal process to cause the p-type dopants in the doped polysilicon layer to diffuse into portions of the p-type substrate that surround a bottom of the shallow trench and walls of the shallow trench;

removing the doped polysilicon layer;

filling an insulator into the shallow trench to form a shallow trench isolation (STI) structure;

performing a first ion implantation process to form a first n-type doped region in the photosensing area; and performing a second ion implantation process to form a second n-type doped region in the photosensing area.

2. The method of claim 1 wherein the dosage of the dopants in the p-type substrate is about $8 \times 10^{14}$ $cm^{-2}$.

3. The method of claim 1 wherein the p-type dopants comprise boron (B) ions, or boron trifluoride ($BF_3$) ions.

4. The method of claim 1 wherein the dosage of the p-type dopants is about between $6 \times 10^{16}$ $cm^{-2}$ to $1 \times 10^{18}$ $cm^{-2}$.

5. The method of claim 1 wherein the n-type dopants in the first n-type doped region comprise arsenic (As) ions, or phosphorous (P) ions.

6. The method of claim 1 wherein the dosage of the dopants in the first ion implantation process is between $8 \times 10^{15}$ $cm^{-2}$ to $6 \times 10^{16}$ $cm^{-2}$.

7. The method of claim 1 wherein the n-type dopants in the second n-type doped region comprise arsenic (As) ions, or phosphorous (P) ions.

8. The method of claim 1 wherein the dosage of the dopants in the second ion implantation process is between $1 \times 10^{19}$ $cm^{-2}$ to $1 \times 10^{20}$ $cm^{-2}$.

9. A method of reducing leakage current of a photodiode on a semiconductor wafer, the surface of the semiconductor wafer comprising a substrate containing first type dopants, a photosensing area for forming a photosensor of the photodiode, and a shallow trench positioned in the substrate surrounding the photosensing area, the method comprising:

forming a first doped region containing first type dopants in portions of the substrate that surround a bottom of the shallow trench and walls of the shallow trench;

filling an insulator into the shallow trench to form a shallow trench isolation (STI) structure;

performing a first ion implantation process to form a second doped region containing second type dopants in the photosensing area; and performing a second ion implantation process to form a third doped region containing second type dopants in the photosensing area.

10. The method of claim 9 wherein the first type dopants are p-type dopants, and the second type dopants are n-type dopants.

11. The method of claim 9 wherein the method of forming the first doped region comprises using a thermal diffusing method to cause dopants to diffuse into portions of the substrate that surround the shallow trench.

12. The method of claim 9 wherein the method of forming the first doped region comprises:

forming a doped polysilicon layer containing first type dopants in the shallow trench;

using a thermal process to cause the first type dopants in the doped polysilicon layer to diffuse into portions of the substrate that surround the bottom of the shallow trench and the walls of the shallow trench; and removing the doped polysilicon layer.

13. The method of claim 9 wherein the first type dopants are p-type dopants, and the dosage of the dopants in the substrate is about $8 \times 10^{14}$ cm$^{-2}$.

14. The method of claim 9 wherein the first type dopants comprise boron (B) ions, or boron trifluoride (BF$_3$) ions.

15. The method of claim 9 wherein the dosage of the dopants in the first doped region is between $6 \times 10^{16}$ cm$^{-2}$ to $1 \times 10^{18}$ cm$^{-2}$.

16. The method of claim 9 wherein the second type dopants comprise arsenic (As) ions, or phosphorous (P) ions.

17. The method of claim 9 wherein the dosage of the dopants in the first ion implantation process is between $8 \times 10^{15}$ cm$^{-2}$ to $6 \times 10^{16}$ cm$^{-2}$.

18. The method of claim 9 wherein the dosage of the dopants in the second ion implantation process is between $1 \times 10^{19}$ cm$^{-2}$ to $1 \times 10^{20}$ cm$^{-2}$.

* * * * *